United States Patent
He et al.

(10) Patent No.: US 9,692,455 B2
(45) Date of Patent: Jun. 27, 2017

(54) MULTI CHANNEL MEMORY WITH FLEXIBLE CODE-LENGTH ECC

(71) Applicant: Micron Technology, Inc., Boise, ID (US)

(72) Inventors: Yuan He, Tokyo (JP); Yutaka Ito, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 108 days.

(21) Appl. No.: 14/852,232

(22) Filed: Sep. 11, 2015

(65) Prior Publication Data
US 2017/0077955 A1    Mar. 16, 2017

(51) Int. Cl.
| | | |
|---|---|---|
| *H03M 13/03* | (2006.01) | |
| *H03M 13/29* | (2006.01) | |
| *G06F 11/10* | (2006.01) | |
| *H03M 13/00* | (2006.01) | |

(52) U.S. Cl.
CPC ..... *H03M 13/2906* (2013.01); *G06F 11/1076* (2013.01); *H03M 13/616* (2013.01)

(58) Field of Classification Search
CPC .. G06F 11/10; G06F 11/1044; G06F 11/1068; G06F 11/1076; G06F 2212/202
See application file for complete search history.

(56) References Cited

U.S. PATENT DOCUMENTS

| | | |
|---|---|---|
| 5,134,616 A | 7/1992 | Barth, Jr. et al. |
| 6,233,717 B1 | 5/2001 | Choi |
| 6,957,378 B2 | 10/2005 | Koga et al. |
| 8,069,377 B2 | 11/2011 | Singh |
| 8,375,257 B2 * | 2/2013 | Hong .............. G06F 11/10 714/48 |
| 2004/0064646 A1 * | 4/2004 | Emerson ........... G06F 13/1684 711/131 |
| 2005/0268203 A1 * | 12/2005 | Keays ............... G06F 11/1048 714/758 |
| 2014/0189468 A1 | 7/2014 | Radke |
| 2015/0074493 A1 | 3/2015 | Kajigaya |

* cited by examiner

*Primary Examiner* — David Ton
(74) *Attorney, Agent, or Firm* — Dorsey & Whitney LLP

(57) ABSTRACT

Apparatuses and methods for error correction and detection of data from memory on a plurality of channels are described. An example apparatus includes: a first memory cell array including first input/output nodes; a second memory cell array including second input/output nodes and third input/output nodes; a first error correcting code (ECC) control circuit including fourth input/output nodes and fifth input/output nodes; and a second ECC control circuit including sixth input/output nodes coupled respectively to the third input/output nodes of the second memory cell array. The fourth input/output nodes of the first ECC control circuit are coupled respectively to the first input/output nodes of the first memory cell array. The fifth input/output nodes of the first ECC are coupled respectively to the second input/output nodes of the second memory cell array.

20 Claims, 9 Drawing Sheets

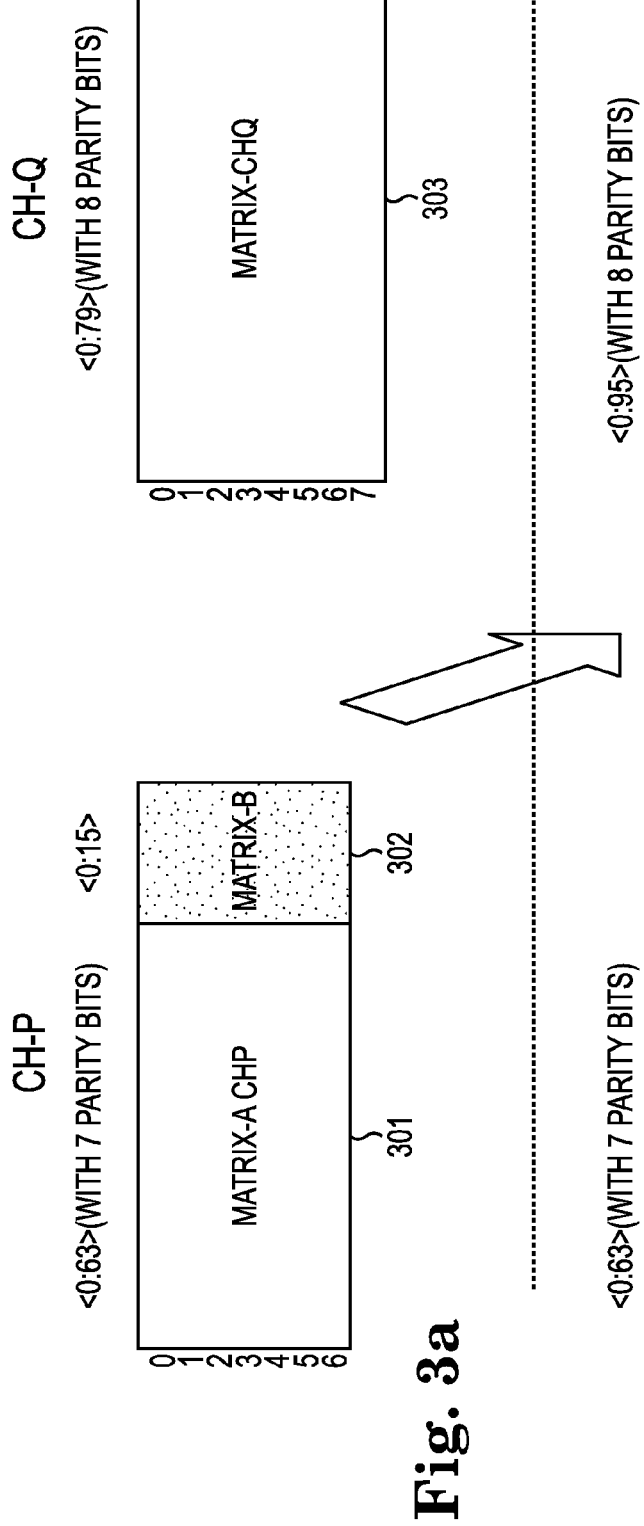
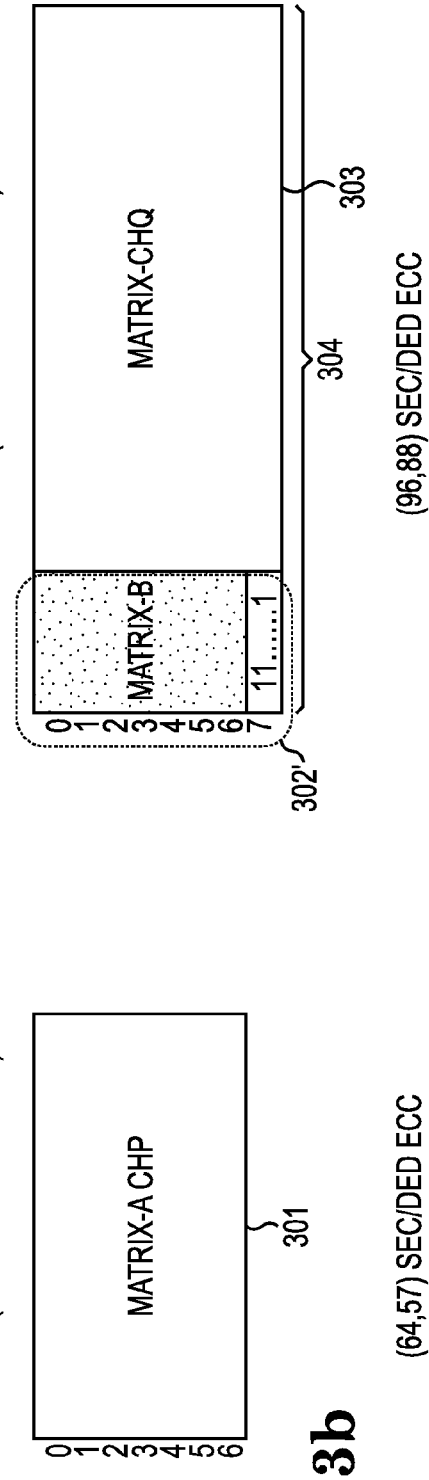
Fig. 3a
Fig. 3b

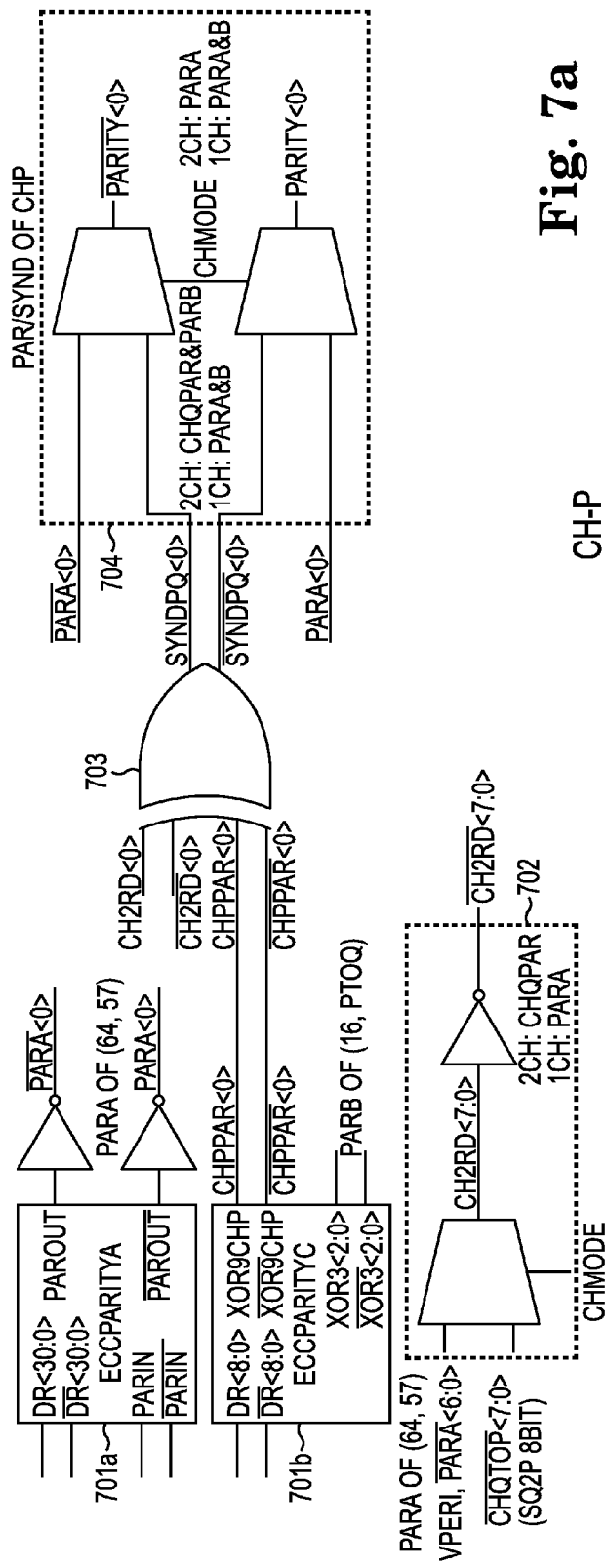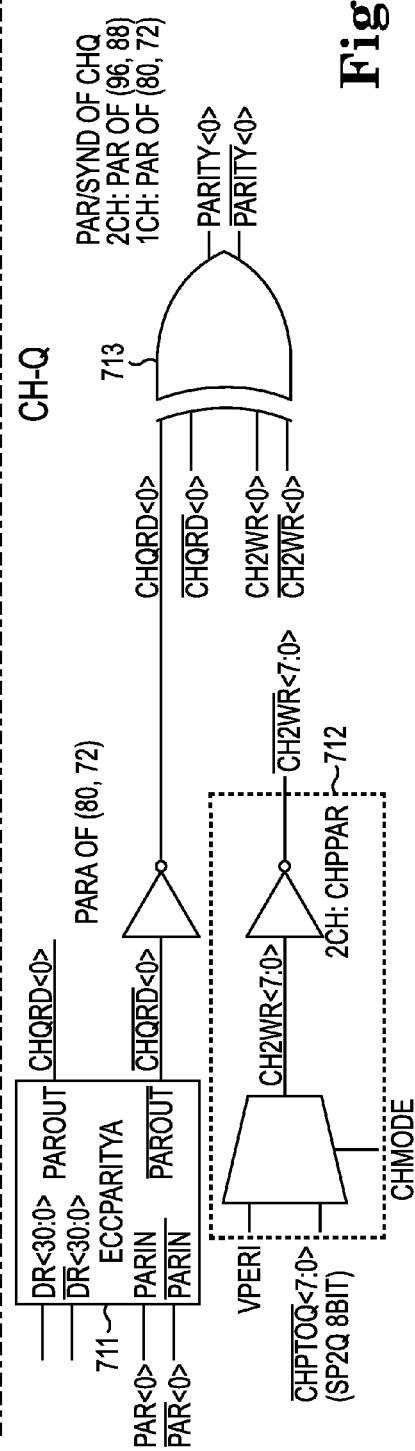
Fig. 7a
Fig. 7b

MULTI CHANNEL MEMORY WITH FLEXIBLE CODE-LENGTH ECC

BACKGROUND

In a semiconductor memory device, memory cells may be susceptible to single-bit errors based on a transient error or a soft error. The single-bit error may be due to a transient error caused by noises from surrounding components in the device with high-density. A soft error may be caused by background radiation. Memories have been developed that include error detection and/or error correcting codes (ECC) to correct these single-bit errors. The error detection and ECC are typically a simple parity check error detection or a relatively simple single-error-correcting (SEC) Hamming code, a single-error-correcting-double-error-detecting (SEC-DED) extended-Hamming code, etc. For high-precision systems that require high reliability, such as network applications, any critical error which causes the system to operate incorrectly is not acceptable and these simple ECC codes may not be sufficient. Thus, these high-precision systems tend to utilize more complex codes which are capable of correcting multiple bits, such as a double-error-correcting-triple-error-detecting (DEC-TED) Bose-Chaudhuri-Hocquenghem (BCH) code and a Reed-Solomon code. However, the complexity of these codes having more check bits may result in increased die size and longer processing time, neither of which may be desirable in high-speed and compact memory applications.

In recent years, there has been an effort to correct memory bit errors while maintaining higher data transfer rates and reducing die sizes. For example, U.S. patent application publication 2014/0189468 A1 describes memory devices including control circuitry which is able to adjust a size of one or more of the ECC coverage areas. Another example is U.S. patent application publication 2015/0074493 A1, which describes a semiconductor device including a reduced number of reference cells for error detection and correction.

BRIEF DESCRIPTION OF THE DRAWINGS

FIGS. 3(a) and 3(b) are simplified block diagrams of data bits, check bits and check matrices of a semiconductor device according to the present disclosure.

FIGS. 7(a) and 7(b) are block diagrams of multi-channel error correction and data flows with optional switches between two different multi-channel modes on two channels according to the present disclosure.

DETAILED DESCRIPTION OF PREFERRED EMBODIMENTS

Figure 1:
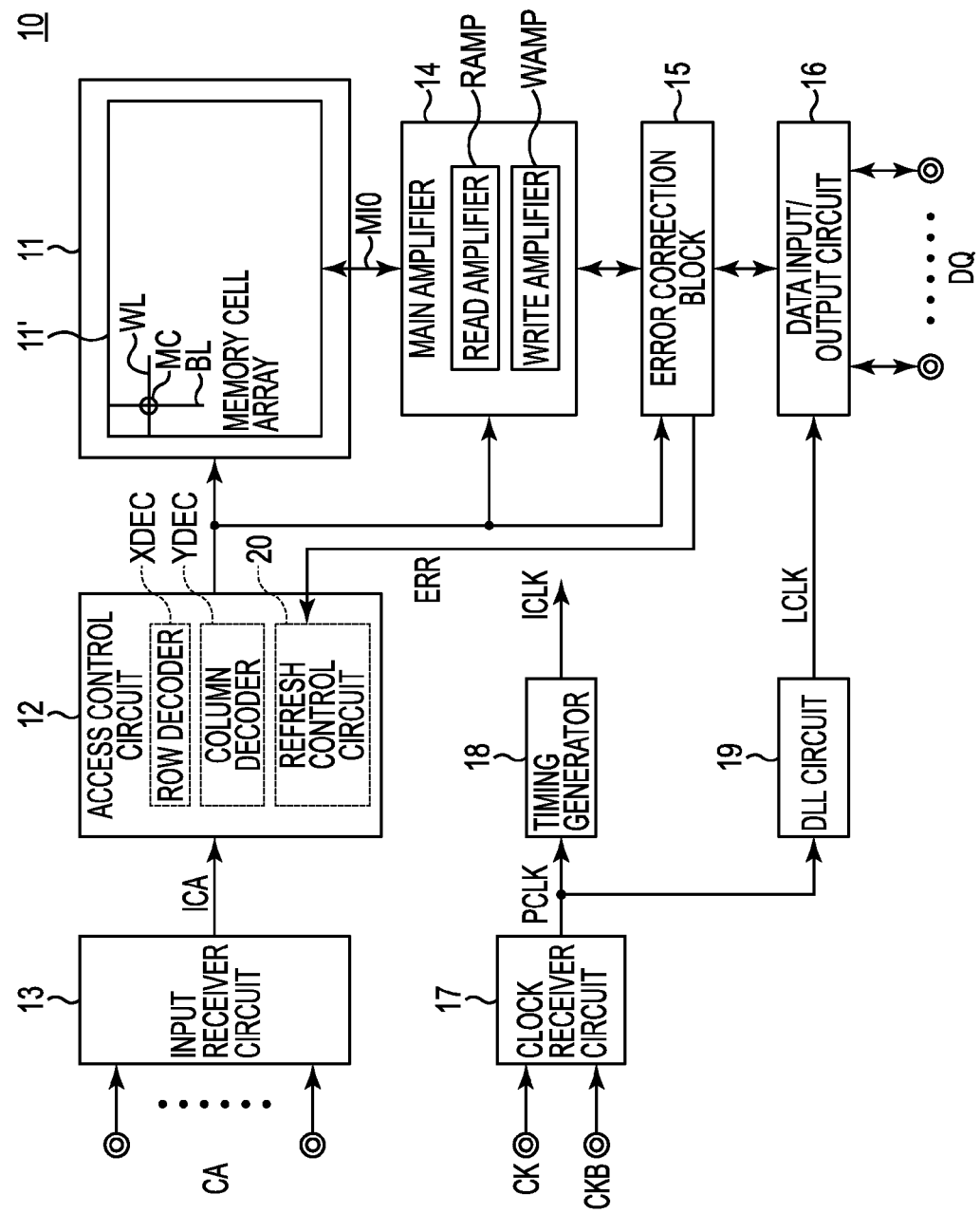
FIG. 1 is a block diagram of a semiconductor device in accordance with the present disclosure.

High data reliability, high speed of memory access, and reduced chip size are features that are demanded from semiconductor memory. Multi-channel memories have been developed to provide memory systems with faster memory access and improved data throughput at lower latency. To maintain high data reliability, ECC has been included in these multi-channel memories. For example, for applications where memory systems are handling data for continuous or possibly non-stop operations, multi-bit data correction codes such as a BCH code with a DEC-TED level of detection/correction ability have been employed. For example, for data having 128 bit data length using the BCD code, 17 check bits (which may also be referred to as a "parity bits") are used resulting in a total of 145 bits of data and ECC bits. In order for BCD data correction to work sufficiently, a number of bit errors tolerated should be less than three among a total of 145 bits. While additional check bits could be included to provide increased error correction capability, this approach typically results in a larger die size and longer processing time.

A memory including memory cell arrays may include a plurality of channels instead of a single channel having a large code length, which may provide relatively high bandwidth and fast data access. An example configuration may have each channel receiving and providing a same number of bits from an array or arrays. ECC processing may be divided among the channels. For example, a memory may include two channels, where each channel is used for about half the code length. Separate ECC processing may be used in each channel to provide half error rate and processing time. In an example having 145 bits on two channels, it is possible to divide the 145 bits into one channel with 73 bits and another channel with 72 bits. Each channel may have a bit-width of 80-bits. Given the 80-bit width of each channel, 7 bits are available for check bits for the second channel whereas 8 bits are available for check bits for the first channel.

TABLE 1

| Data Bits (SEC/SEC-DED) | Check bits SEC | Check bits SEC-DED | Check bits DEC-TED |
|---|---|---|---|
| 16 (12-26) | 5 | 6 | 11 |
| 32 (27-57) | 6 | 7 | 13 |
| 64 (58-120) | 7 | 8 | 15 |
| 128 (121-247) | 8 | 9 | 17 |

Table 1 shows several relationships between the number of data bits to be checked for potential errors and the number of corresponding check bits for different levels of error correction and detection such as SEC, SEC-DED and DEC-TED. Hereafter, a notation (c, d) is used for describing a code with a code length c and a data length d. For example, it is possible to execute SEC-DED ECC for up to 120 bits with eight check bits. However, only 57 bits can be properly checked and corrected applying SEC-DED with seven check bits. As applied to the example of the first and second channels previously described, this implies that while the eight check bits for the first channel are sufficient to provide SEC-DED ECC for the 72 bits of data, the seven check bits for the second channel are not sufficient for SEC-DED ECC for the 73 bits of data.

As will be described in more detail below, semiconductor memories according to the present disclosure include error detection and correction where some data bits on a first channel are assigned to an ECC control circuit on a second channel using a set of check bits of the second channel. By assigning some data bits on the first channel for error detection and correction on the second channel, it may be possible to provide ECC for a larger total data size compared with using check bits available on the respective channels.

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

FIG. 1 is a block diagram of a semiconductor device in accordance with the present disclosure. The semiconductor device 10 includes a memory core 11 that can store data. The memory core 11 has a memory cell array 11' that can store user data (DQ) and parity data used as error detection and correction information for ECC. The memory cell array 11' has multiple word lines WL, multiple bit lines BL, and multiple DRAM cells arranged at intersections of the word lines WL and the bit lines BL.

The semiconductor device 10 includes an input receiver circuit 13 that receives an external command address signal CA and generates an internal command address signal ICA based on the external command address signal CA. In order to access the memory core 11, the semiconductor device 10 includes an access control circuit 12 that controls operations of various circuit blocks in the semiconductor device 10 based on the internal command address signal ICA. The access control circuit 12 has a row decoder XDEC, a column decoder YDEC, and a refresh control circuit 20. The row decoder XDEC accesses to the memory core 11 in a row direction, while the column decoder YDEC accesses to the memory core 11 in a column direction. The refresh control circuit 20 receives a refresh signal IREF, which is one type of the internal command address signal ICA, the row address is supplied and a refresh operation is executed. Additionally, the refresh control circuit 20 may also receive an error signal ERR from an error correction block 15 to execute the refresh operation.

When a column access is performed to the memory core 11, the memory cell array 11' is coupled to a main amplifier 14 via a main data line MIO. The main amplifier 14 has a read amplifier RAMP and a write amplifier WAMP. The read amplifier RAMP can be activated at execution of a read operation, to amplify the user data DQ and the parity data read out from the memory cell array 11' via the main data line MIO. The write amplifier WAMP can be activated at execution of a write operation, to write user data DQ and error correction information ECC to the memory cell array 11' via the main data line MIO.

The main amplifier 14 is coupled to a data input/output circuit 16 via the error correction block 15, which will be described in detail later. At execution of the read operation, the data input/output circuit 16 transmits the user data DQ corrected by the error correction block 15 as output data of the semiconductor device 10. At execution of the write operation, the data input/output circuit 16 receives input user data DQ to the error correction block 15 from external terminals.

The semiconductor device 10 includes a clock receiver circuit 17 that may receive complementary external clock signals CK and CKB and that may generate an internal clock signal PCLK. The internal clock signal PCLK is supplied to a timing generator 18 and to a DLL circuit 19. The timing generator 18 can generate an internal clock signal ICLK, based on the internal clock signal PCLK. The internal clock signal ICLK may be supplied to various circuit blocks including the access control circuit 12 and the amplifier 14. The DLL circuit 19 can generate a phase-controlled output clock signal LCLK, based on the internal clock signal PCLK. The output clock signal LCLK may be supplied to the data input/output circuit 16, where the output clock signal LCLK determines timing of outputting user data DQ from the data input/output circuit 16 to the outside.

Figures 2A, 2B:
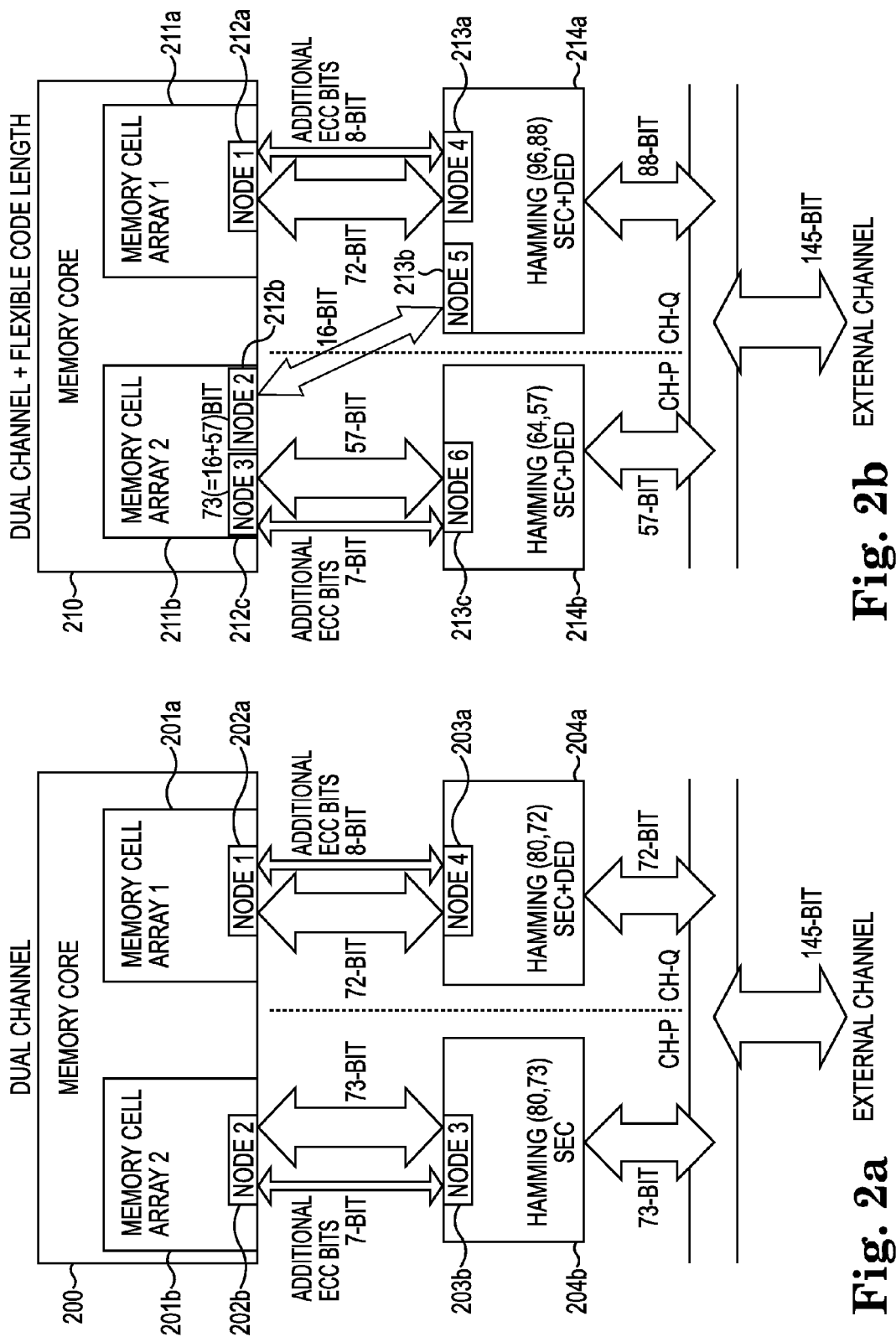
FIGS. 2(a) and 2(b) are block diagrams of error correction blocks according to the present disclosure.

FIGS. 2(a) and 2(b) are block diagrams of error correction blocks according to the present disclosure. FIG. 2(a) illustrates two channels provided for coupling between a memory core and the error correction block 15. In order to achieve a high bandwidth, a total 145 bits including 128 data bits and 17 check bits from the memory core may be divided into two channels as a first channel (Ch-P) with 73 bits and a second channel (Ch-Q) of 72 bits. In FIG. 2(a), a memory core 200 includes a first 80-bit memory cell array 201a and a second 80-bit memory cell array 201b provided for Ch-Q and Ch-P respectively. On Ch-Q, a first node 202a of the first memory cell array 201a is coupled to a fourth node 203a of a first ECC control circuit 204a for executing SEC-DED process. Similarly, on Ch-P, a second node 202b of the second memory cell array 201b is coupled to a third node 203b of a second ECC control circuit 204b for executing SEC process concurrently with Ch-Q. Therefore, the embodiment in FIG. 2(a) allows Ch-P and Ch-Q to have extra 7 bits and 8 bits respectively, which may be available for ECC processing on both channels. As previously discussed with reference to Table 1, it is possible to execute SEC-DED ECC for up to 120 bits with eight check bits. However, only 57 bits can be properly checked and corrected applying SEC-DED with seven check bits. Thus, for Ch-Q, SEC-DED processing can be executed because 8 bits are available for this ECC process of 72 bits (less than a maximum of 120 bits that can be corrected using SEC-DED). However, SEC-DED processing cannot be executed for Ch-P because only 7 bits are available for the ECC process of 73 bits (greater than the maximum 57 bits that can be corrected using SEC-DED) which are sufficient for executing SEC but insufficient for SEC-DED processing.

While 8 bits in Ch-Q (80, 72) are sufficient to execute SEC-DED processing up to 120 bits while 7 bits in Ch-P (80, 73) are sufficient to execute SEC-DED processing up to 57 bits, as shown in Table 1, it is possible to apply SEC-DED on a total of 145 data bits in Ch-P and Ch-Q by keeping the number of bits on Ch-P under 57 bits while increasing the number of bits on Ch-Q up to 120 bits.

In FIG. 2(b), similarly to FIG. 2(a), a memory core 210 including a first 80-bit memory cell array 211a and a second 80-bit memory cell array 211b are provided for Ch-Q and Ch-P respectively. On Ch-Q, a first node 212a of the first memory cell array 211a is coupled to a fourth node 213a of a first ECC control circuit 214a for executing a SEC-DED process. A connection between the first node 212a and the fourth node 213a also includes 8 bits of ECC. Because the 8 bits of ECC enable a SEC-DED process for more than 72 bits, a second node 212b of the second memory array 211b may be coupled to a fifth node of 213b of the first ECC control circuit 214a to transfer extra bits. In this example, 16 data bits can be transferred between the second node 212b and the fifth node 213b. However, it will be appreciated by those of ordinary skill in the art that any number of extra bits within error correction capacity of the additional ECC 8 bits (e.g., error correction capacity of 120 bits) can be transferred between the second memory cell array 211b and the first ECC control circuit 214a in this manner without departing from the scope of the present disclosure. On Ch-P, a third node 212c of the second memory cell array 211b is coupled to a sixth node 213c of a second ECC control circuit 214b for executing SEC-DED process, concurrently with Ch-Q. The first ECC control circuit 214a provides 88 bits (72 bits from memory cell array 211a+16 bits from memory cell array 211b) after SEC-DED process and the second ECC control circuit 214b provides 57 bits after SEC-DED process, thus the total of 145 bits can be provided after SEC-DED process.

As illustrated by the previous example, by transferring some bits of data originally provided to the second memory cell array to Ch-P as previously described with reference to FIG. 2(b), it is possible to apply SEC-DED on more than 144 bits data of Ch-P and Ch-Q. Where bits of Ch-P are transferred to Ch-Q and both ECC channels work concurrently, a number of data bits for ECC are sufficient to support SEC-DED ECC for all of the data.

FIGS. 3(a) and 3(b) are simplified block diagrams of data bits, check bits and check matrices of a semiconductor device according to the present disclosure. FIGS. 3(a) and 3(b) illustrate matrices executed on the ECC control circuits of the error correction block 15 coupled to a memory core via multi channels as illustrated in FIG. 2(b). As shown in FIG. 3(a), 80 bits of Ch-P may be separately processed by two operational matrices. In particular, 57 bits of the 80 bits are processed by a sub-operational matrix 301 (Matrix-A ChP) and 16 bits of the 80 bits are processed by a sub-operational matrix 302 (Matrix-B). As for Ch-Q, 80 bits including 8 parity bits are processed with a third operational matrix 303 (Matrix-ChQ). Thus, the sub-operational matrix 302 becomes a part of SEC/DED ECC processing on Ch-Q as shown in FIG. 3(b). A fourth operational matrix 302' includes an extra 1 bit "1" added on the eighth row (Row 7) of the sub-operational matrix 302 because the sub-operational matrix 302 is based on 7 bit parity and in order to be properly processed by the extended Hamming code. Thus, a first operational matrix 304 of Ch-Q includes the third operational matrix 303 (Matrix-ChQ) of Ch-Q and further includes a modified sub-operational matrix. The first operational matrix 304 is used in executing the SEC-DED process for 88 bits data including 72 bits from Ch-Q and 16 bits from Ch-P, and 8 check bits from Ch-Q. Ch-P includes a second operational matrix 301 (Matrix-A ChP) for processing 64 bits including 7 parity bits, excluding the transferred 16 bits. In the example of FIG. 3(b), operational matrices based on extended Hamming codes for SEC-DED are illustrated. However, parity check matrices of any other ECC codes which meet a correction and detection level of SEC-DED may be used in other embodiments.

To produce syndromes based on SEC-DED on two channels it is possible to generate pre-syndrome (which may also be referred to as a "pre-parity") 8 bits for 16 bits data on Ch-P for a SEC-DED code such as the extended Hamming code and provide the pre-parity 8 bits to Ch-Q. On Ch-Q, the 8 parity bits and syndrome for the entire 88 bits of data are generated and the syndrome provided to Ch-P. However, this pre-parity generation scheme may exceed a desired address access time (tAA) because of transmission time for sending the pre-parity 8 bits from Ch-P to Ch-Q and receiving the syndrome 8 bits from Ch-Q to Ch-P.

Figure 4:
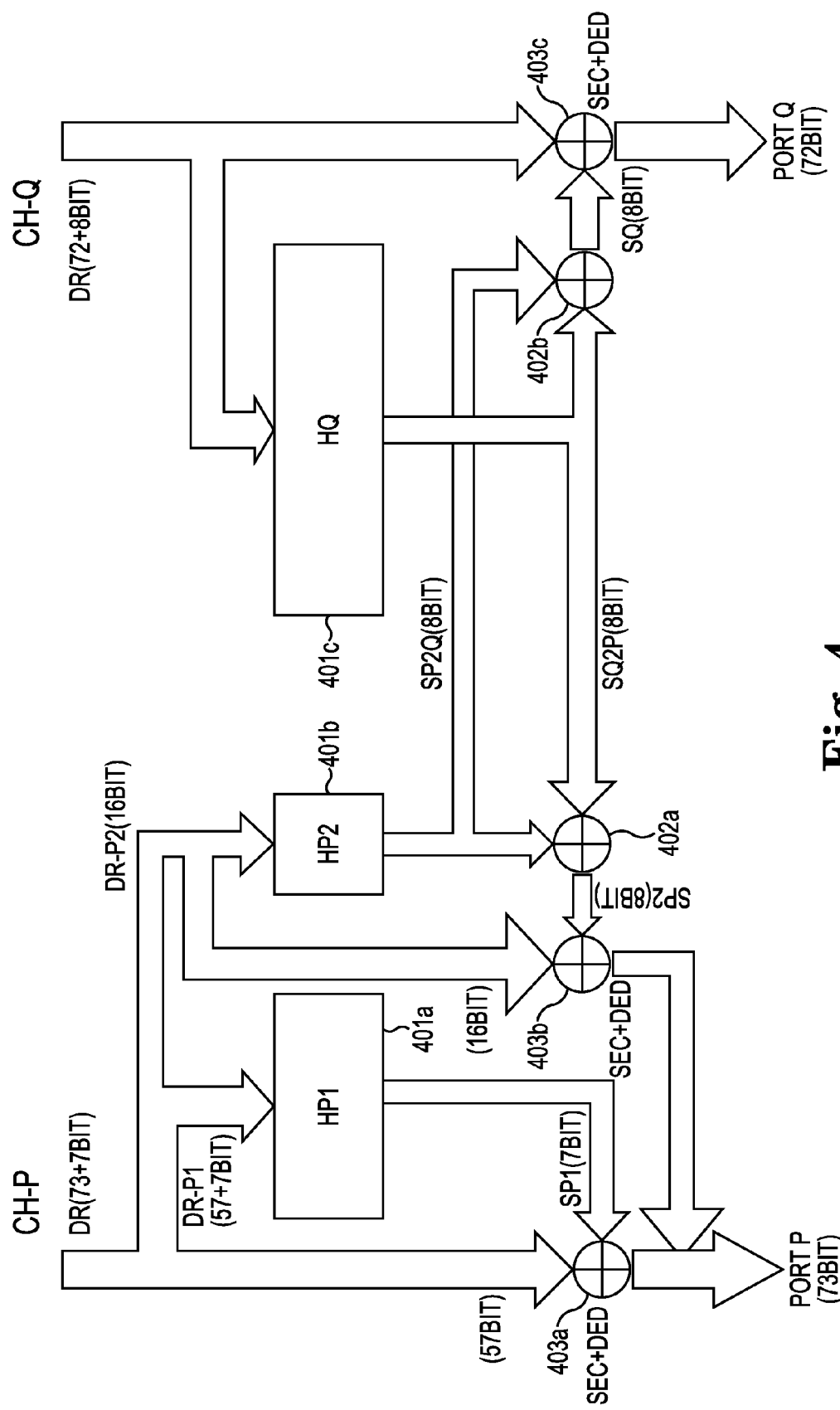
FIG. 4 is a schematic diagram of multi-channel error correction processes and data flows according to the present disclosure.

FIG. 4 is a schematic diagram of multi-channel error correction processes and data flows according to the present disclosure. FIG. 4 illustrates a schematic diagram of flows of data bits and parity bits among the two channels, Ch-P and Ch-Q for shortening the parity and syndrome transmission time. 64 bits including 7 parity bits in Ch-P are provided to a first parity check matrix (Hp1) 401a to provide a first syndrome SP1 and 16 bits in Ch-P are provided to a second parity check matrix (Hp2) 401b for generating a first pre-parity SP2Q (8bit). 72 bits in Ch-Q (80, 72) are provided to a third parity check matrix (Hq) 401c for generating a second pre-parity SQ2P (8bit). The first pre-parity SP2Q and the second pre-parity SQ2P may be generated simultaneously and provided to Ch-P and Ch-Q. The first syndrome SP1 from the first parity check matrix (Hp1) is forwarded to a first corrector 403a for detecting and correcting errors in the 57 bits using the first syndrome SP1. In Ch-P, SQ2P and SP2Q are combined at a first adder 402a to provide a second syndrome SP2 which is forwarded to a second corrector 403b. The second corrector 403b executes error detection and correction of the 16 bits transferred to Ch-Q using the first syndrome SP2. In Ch-Q, SQ2P and SP2Q are combined at a second adder 402b to provide an 8-bit syndrome SQ which is forwarded to a third corrector 403c for error detection and correction of the 72 bits. The ECC pre-parity bits may be transmitted between the channels and the syndromes can be obtained without waiting for receiving a syndrome based on pre-parity or enhancing data widths in bits which causes area penalty. As a result, the ECC pre-parity bits may be generated in a shorter time to improve tAA.

Figure 5:
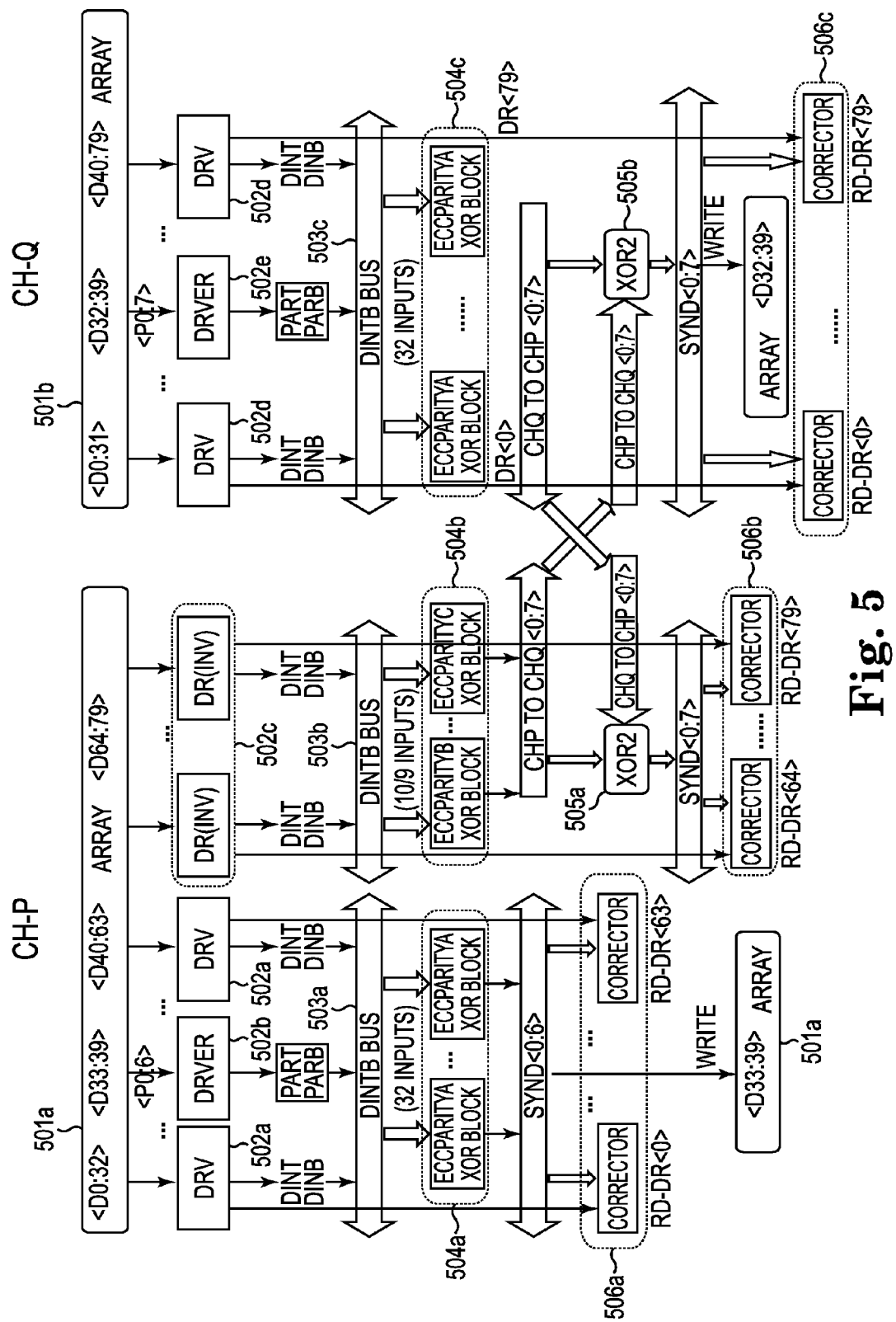
FIG. 5 is a block diagram of multi-channel error correction processes and data flows among components according to the present disclosure.

FIG. 5 is a block diagram of multi-channel error correction processes and data flows among components according to the present disclosure. FIG. 5 illustrates a layout of ECC control circuits including components and conceptual data flows through the components. For example, first data and check bits on Ch-P are read from a first memory cell array 501a and second data and check bits on Ch-Q are read from a second memory cell array 501b. Typical ECC control circuits employ static exclusive-or (XOR) trees for parity computation which tend to have glitches. To reduce such glitches, signals are first provided to drivers which provide the signals' true state and complementary state. In FIG. 5, 57 data bits <D0:32> and <D40:63> of Ch-P are provided to first drivers 502a and their corresponding seven check bits <P0:6> are provided to second drivers 502b. Also, the 16 data bits <D64:79> on Ch-P are provided to third drivers separately from the 57 data bits because the 16 data bits are processed separately with another set of check bits stored in Ch-Q. In a meanwhile, 72 data bits <D0:31> and <D40:79> of Ch-Q are provided to fourth drivers 502d and check bits <P0:7> are provided to fifth drivers 502e. In this manner, each bit is provided to its corresponding driver and its true state and complementary bar state are provided as output signals from the corresponding driver to prevent effects due to glitches.

The output signals from the drivers may be transferred to ECC parity XOR blocks via data input buses. For example, the 57 data bits and the check bits of Ch-P are provided to first ECC parity blocks 504a with 32 inputs and the first ECC parity blocks 504a provides a first 7-bit syndrome which is used for data correction of 57 bits at first correctors 506a. In a meanwhile, the 72 bits and the check bits of Ch-Q are provided to third ECC parity blocks 504c with 32 inputs for generating first 8-bit pre-parity which is transferred from Ch-Q to Ch-P. The 16 data bits of Ch-P are provided to second ECC parity blocks 504b for generating second 8-bit pre-parity which is provided from Ch-P to Ch-Q. A first XOR logic 505a of Ch-P and a second XOR logic 505b of Ch-Q both receive the first 8-bit pre-parity and the second 8-bit pre-parity and generate a second 8-bit syndrome. The second 8-bit syndrome generated at the first XOR logic 505a is provided to second correctors 506b for data correction of the 16 data bits <D64:79>. The second 8-bit syndrome generated at the second XOR logic 505b is provided to third correctors 506c for data correction of the 72 bits of Ch-Q. Thus, ECC memory processing of two channels with flexible code-length ECC can be achieved.

In one embodiment, as illustrated in FIG. 5, it is possible to assign storage cells of check bits in the center areas of arrays. The data input buses may have shared-bus architecture. The 57 data bits of Ch-P and their corresponding seven check bits may use a first bus 503a, the other 16 data bits <D64:79> of Ch-P may use a second bus 503b, and the 80 bits on Ch-Q uses a third bus 503c. These features may contribute to high speed data transmission and layout flexibility.

In another embodiment, a plurality of independent (80, 72) channels are included, each having 8 check bits, instead of dividing a large data width into two channels. In this way, it is not possible to have a high bandwidth such as a total 145 bits including 128 data bits and 17 check bits suitable for BCH ECC; however, by having 80-bit memory cell arrays with simple SEC-DED ECC for 128 data bits, it is possible to keep same formation of both two channels.

Figure 6:
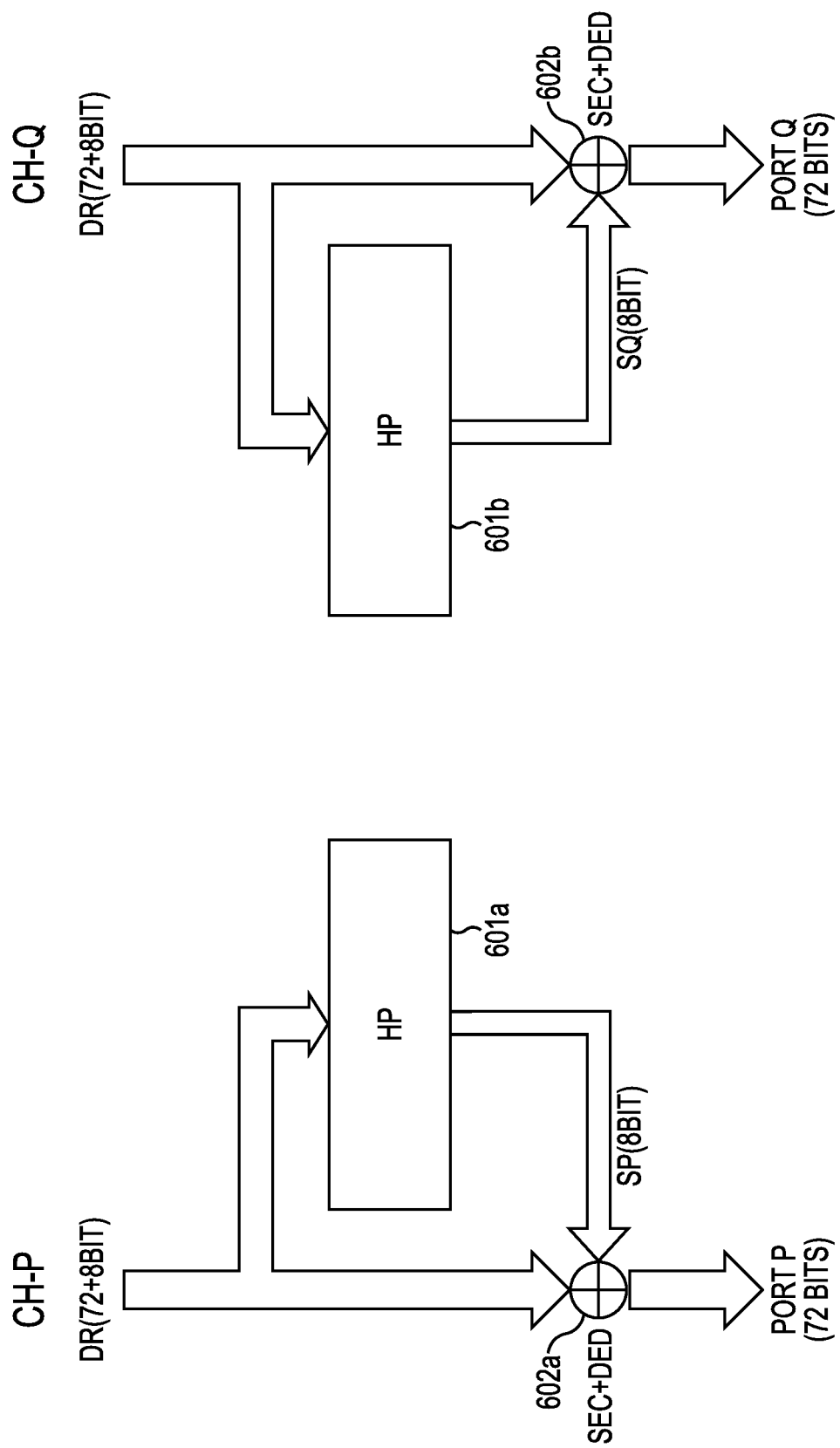
FIG. 6 is a schematic diagram of multi-channel error correction processes and data flows according to the present disclosure.

FIG. 6 is a schematic diagram showing configurations of multi-channel error correction processes and data flows according to the present disclosure. FIG. 6 illustrates a schematic diagram of flows having 72 data bits and 8 check bits in each of the two channels, Ch-P and Ch-Q. The embodiment of FIG. 6 may be used for providing up to 144 data bits with SEC-DED ECC. 72 bits in Ch-P (80, 72) are provided to a first parity check matrix (Hp) 601a for generating a first 8 bit syndrome SP. Similarly, 72 bits in Ch-Q (80, 72) are provided to a second parity check matrix (Hq) 601b for generating a second 8 bit syndrome SQ. In Ch-P, the first syndrome SP is provided to a first corrector 602a for SEC-DED process of 72 bits. In Ch-Q, the second syndrome SQ is then provided to a second corrector 602b for SEC-DED process of 72 bits. Thus, similar channel structures may be applied across independent channels and simple designs with simple data correction may be achieved.

FIGS. 7(a) and 7(b) are block diagrams showing logic circuitry of multi-channel error correction and data flows with optional switches between two different multi-channel modes on two channels according to the present disclosure. FIGS. 7(a) and 7(b) illustrate components and data flows through the components, according to an embodiment including option switches between a 145 bit channel mode for BCH (indicated as "2Ch") and a 72×2 bit mode (indicated as "1Ch").

In Ch-P, as illustrated in FIG. 7(a), a first ECC Parity circuit 701a receives data bits and parity bits of Ch-P and provides 7 check bits. At the same time, in Ch-P, a second ECC parity circuit 701b receives 16 bits and prepares a first pre-parity. A first option switch 702 is a multiplexer which receives a ChMode signal as a selector input indicative of either a 2Ch mode or a 1Ch mode. When the ChMode is indicative of the 2Ch mode, a second pre-parity from Ch-Q to Ch-P is provided as output signals, whereas the seven-bit check bits from the first ECC parity circuit is provided as output signals if the ChMode is indicative of the 1Ch mode. The output signals from the first option switch 702 and the output signal of the second ECC Parity circuit 701b are used as input signals of a first XOR logic 703 and a syndrome for Ch-P is provided as a result based on the ChMode. There is a second option switch 704, which is a combination of multiplexers which receives ChMode as a selector input, and also receives the output signals of the first XOR logic and the output of the first ECC parity circuit as input signals. The second option switch 704 provides a combination of the first pre-parity and the second pre-parity as a check result in case of the 2Ch mode, whereas the second option switch 704 provides a check result of all data in Ch-P in case of the 1Ch mode.

In Ch-Q, as illustrated in FIG. 7(b), a third ECC Parity circuit 711 receives data bits and parity bits of Ch-Q and provides 8 check bits. A third option switch 712 is a multiplexer which receives a ChMode signal as a selector input indicative of either the 2Ch mode or the 1Ch mode. When the ChMode is indicative of the 2Ch mode, a first pre-parity from Ch-P to Ch-Q is provided as output signals. The output signals from the third option switch 712 and the output signal of the third ECC Parity circuit 711 are used input signals of a second XOR logic 713 and a check result for Ch-Q, either including the 16 bits from Ch-P in computation of check bits and a syndrome or excluding the 16 bits from Ch-P, is provided based on the ChMode.

Figure 8A:
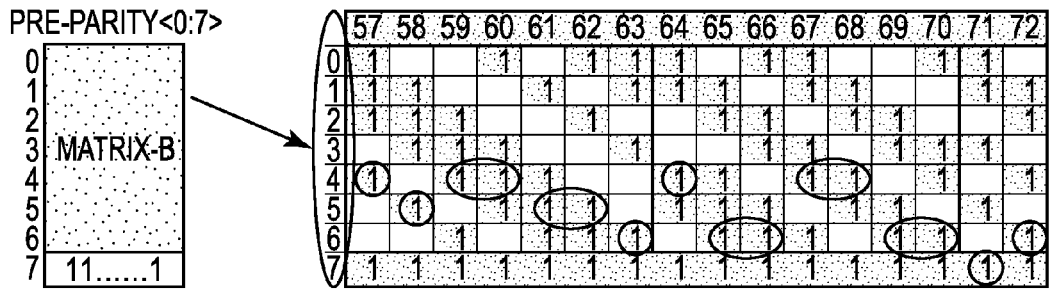
FIG. 8(a) is a sample parity check matrix transferred across two channels according to the present disclosure.

In another embodiment, a faster parity/syndrome computation technique is introduced. The extended Hamming code with SEC-DED includes an extra parity bit in order to increase its minimum distance of the code which enables the code to detect two-bit errors. This extra parity bit results in a row with all "1" bit in the extended Hamming code. For example, in case of 8-bit pre-parity for 16 bits, a parity matrix as shown in FIG. 8(a). The row with all "1" bits may cause a decrease in multiple-input of XOR logic. To improve this bottleneck, it is possible to use internal nodes of other pre-parity bit generators. As shown in FIG. 8(a), by obtaining data inputs from pre-parity bits <4:6>, it is possible to cover the pre-parity information for pre-parity bit <7>.

Figure 8B:
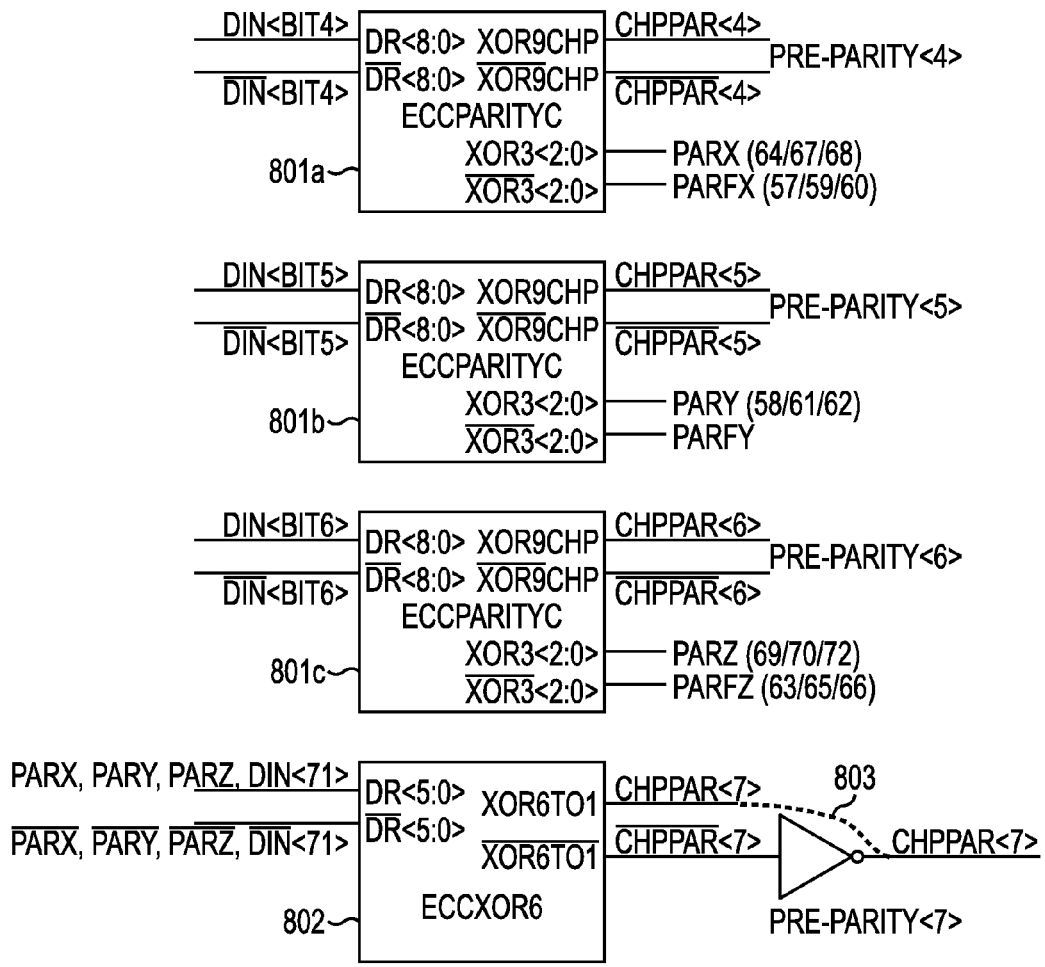
FIG. 8(b) is a block diagram of logic circuitry for the multi-channel error correction and data flows of FIG. 8(a).

FIG. 8(b) shows sample circuit configuration of this embodiment. ECC parity circuits 801a, 801b, and 801c, the above pre-parity bit generators, receive input signals for pre-parity <4>, pre-parity <5> and pre-parity <6>, respectively. Additionally to producing pre-parity data as previously described, the ECC parity circuits 801a, 801b, and 801c also provide output signals. For example, a first ECC parity circuit 801a provides a ParX signal as a result of XOR logic from input data signals <64, 67, 68> and further provides a ParfX signal as a result of 3-input XOR logic from input data signals <57, 59, 60>. Similarly, the second ECC parity circuit 801b provides a ParY signal as a result of XOR logic from input data signals <58, 61, 62>. The third ECC parity circuit 801c provides a ParZ signal as a result of XOR logic from input data signals <69, 70, 72> and further provides a ParfZ signal as a result of XOR logic from input data signals <63, 65, 66>. An ECC circuit with a 6-input XOR 802 receives the signals ParX, ParfX, ParY, ParZ, ParfZ and the input data signal <71> and provides pre-parity <7> instead of taking a full weight of the code with a row with all "1". It is also possible to include a short circuit 803 which may couple an output of its true state and an output an inverter which receives an output signal of its complementary state. This may reduce extra time of any critical node after the ECC circuit 802.

Figure 9:
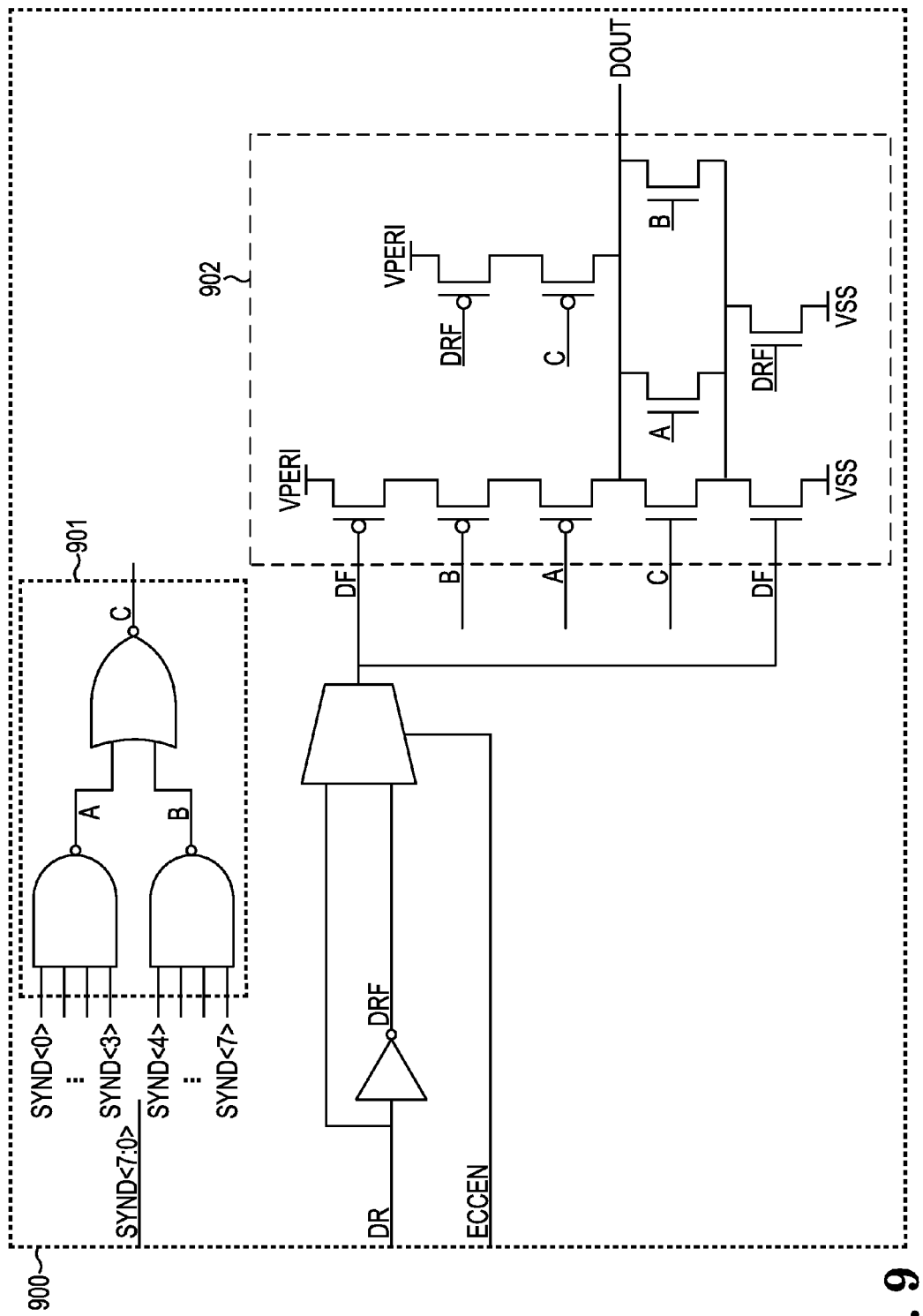
FIG. 9 is a block diagram of logic circuitry for a syndrome decoder according to the present disclosure.

In another embodiment, as illustrated in FIG. 9, a syndrome decoder 901 in the error correction block 900 receives an 8-bit syndrome. The 8-bit syndrome is received by two NAND logics and output signals at nodes "a" and "b" of the two NAND logics are received at a NOR logic. If an output signal at a node "c" of the NOR logic which is an output stage of the syndrome decoder 901 is logic low, then data correction is not executed. If the output signal from the syndrome decoder 901 at the node "c" is logic high, error correction is executed. An error correction circuit 902 of the error correction block 900 receives four input signals: a "df" signal indicative of either read data "DR" or its complementary state "DRf", the intermediate signals from internal nodes "a" and "b" of the syndrome decoder 901, and the output signal at the node "c" of the syndrome decoder 901.

In operation, if the output signal from the syndrome decoder 901 is logic low, the read data "DR" is provided as an output signal "Dout" of the error correction circuit 902. If the output signal from the syndrome decoder 901 is logic high, the correction is activated. The error correction circuit 902 adopts a dynamic type circuit which functions in a flip-flop manner responsive to the output signal of the syndrome decoder 901 at the node c. As described above, data corrections in the error correction circuit 902 are executed according to timings based on the output signal from the syndrome decoder 901, thus faster data error correction can be executed.

According to various aspects of the present disclosure, more information data bits for further correction with BCH code can be once checked and corrected by the extended Hamming code for SEC-DED process. By flexibly assigning error correction and detection code lengths across a plurality of channels and maximizing SEC-DED data correction to the capacity of all available check bits on a memory device, it is possible to achieve larger data parity and syndrome generation and read data correction without causing penalty of occupying a larger area on a die of the memory device while keeping shorter processing time.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
    a first memory cell array including a plurality of first input/output nodes;
    a second memory cell array including a plurality of second input/output nodes and a plurality of third input/output nodes;
    a first error correcting code (ECC) control circuit including a plurality of fourth input/output nodes coupled respectively to the plurality of first input/output nodes of the first memory cell array and a plurality of fifth input/output nodes coupled respectively to the plurality of second input/output nodes of the second memory cell array; and
    a second ECC control circuit including a plurality of sixth input/output nodes coupled respectively to the plurality of third input/output nodes of the second memory cell array.

2. The apparatus of claim 1, wherein the plurality of the first input/output nodes of the first memory cell array are equal in number to a sum of the plurality of second and third input/output nodes of the second memory cell array, wherein a sum of the plurality of fourth and fifth input/output nodes of the first ECC control circuit is greater in number than the plurality of sixth input/output nodes of the second ECC control circuit.

3. The apparatus of claim 2, wherein the first ECC control circuit is configured to produce and receive first data and the second ECC control circuit is configured to produce and receive second data that is smaller in bit number than the first data.

4. The apparatus of claim 1, wherein the first ECC control circuit includes a first operational matrix and the second ECC control circuit includes a second operational matrix that is different from the first operational matrix.

5. The apparatus of claim 4, wherein the first operational matrix includes a third operational matrix configured to process third data received at the fourth input/output node and a fourth operational matrix configured to process fourth data received at the fifth input/output node, and wherein the first ECC circuit is configured to provide a first pre-syndrome based on the third operational matrix and provide a second pre-syndrome based on the fourth operational matrix, wherein the first ECC circuit is further configured to provide a first syndrome based on the first pre-syndrome and the second pre-syndrome.

6. The apparatus of claim 5, wherein the first ECC control circuit includes ECC parity blocks corresponding to the fourth operational matrix configured to receive the fourth data at the fifth node and to provide the second pre-syndrome including first, second, third and fourth pre-syndrome bits, wherein the first pre-syndrome bit, the second pre-syndrome bit, and the third pre-syndrome bit are generated by first, second and third ECC parity circuits respectively, and wherein the fourth pre-syndrome bit is provided by using intermediate data of the first and second and third ECC parity circuits.

7. The apparatus of claim 1, wherein the first ECC control circuit includes a first operational switch set and the second ECC control circuit includes a second operational switch set, the first operational switch set and the second operational switch set are configured to switch between a first mode and a second mode, wherein in the first mode a sum of the plurality of fourth and fifth input/output nodes of the first ECC control circuit is greater in number than the plurality of sixth input/output nodes of the second ECC control circuit, and wherein in the second mode the plurality of fourth input/output nodes are coupled to the first input/output node and the plurality of sixth input/output nodes are also coupled to the second and third input/output nodes in which a sum of the plurality of fourth and fifth input/output nodes of the first ECC control circuit is equal in number to the plurality of sixth input/output nodes of the second ECC control circuit.

8. The apparatus of claim 1, wherein the first ECC control circuit and the second ECC control circuit each include a syndrome decoder and an error correction circuit, wherein the error correction circuit is configured to receive at least one output signal of the syndrome decoder, and wherein timings of data correction are based on the at least one output signal from the system decoder.

9. A method of error detection and correction comprising:
receiving first data at a first ECC control circuit, the first data including data from a plurality of input/output nodes of a first memory cell array received at a first plurality of input/output nodes of the first ECC control circuit, and further including data from a first plurality of input/output nodes of a second memory cell array received at a second plurality of input/output nodes of the first ECC control circuit; and
receiving second data from a second plurality of input/output nodes of the second memory cell array received at a plurality of input/output nodes of a second ECC control circuit.

10. The method of claim 9, wherein the plurality of the input/output nodes of the first memory cell array are equal in number to a sum of the first and second pluralities of the input/output nodes of the second memory cell array.

11. The method of claim 9, further comprising:
producing the first data at the first ECC control circuit; and
producing the second data at the second ECC control circuit that is smaller in bit number than the first data.

12. The method of claim 9, further comprising:
processing the first data at the first ECC control circuit with a first operational matrix; and
processing the second data at the second ECC control circuit with a second operational matrix different from the first operational matrix based on number of bits of data to be related.

13. The method of claim 12, wherein the first operational matrix includes a third operational matrix configured to process third data received at the first plurality of input/output nodes of the first memory cell array and further includes a fourth operational matrix configured to process fourth data received at the second plurality of input/output nodes, the method further comprising:
providing first pre-syndrome based on the third operational matrix;
providing second pre-syndrome based on the fourth operational matrix; and
providing a first syndrome based on the first pre-syndrome and the second pre-syndrome.

14. The method of claim 13, wherein the first ECC control circuit includes ECC parity blocks corresponding to the fourth operational matrix, the ECC parity blocks including first, second and third ECC parity circuits, the method further comprising:
generating first, second and third pre-syndrome bits of the second pre-syndrome by the first, second and third ECC parity circuits respectively; and
providing the fourth pre-syndrome bit by using intermediate data of the first and second and third ECC parity circuits.

15. The method of claim 9, wherein the first ECC control circuit includes a first operational switch set and the second ECC control circuit includes a second operational switch set, wherein the first operational switch set and the second operational switch set are configured to switch between a first mode and a second mode, wherein in the first mode a sum of the first and second pluralities of input/output nodes of the first ECC control circuit is greater in number than the plurality of input/output nodes of the second ECC control circuit, and wherein in a second mode the first plurality of input/output nodes of the first ECC control circuit are coupled to first input/output nodes of the first memory cell array and the plurality of input/output nodes of the second ECC control circuit are also coupled to the first and second pluralities of the second memory cell array in which a sum of the first and second pluralities of input/output nodes of the first ECC control circuit is equal in number to the plurality of sixth input/output nodes of the second ECC control circuit.

16. The method of claim 9, wherein at least one of the first ECC circuit and the second ECC circuit includes a syndrome decoder and an error correction circuit, the method further comprising, the method further comprising:
receiving at least one output signal from the syndrome decoder as one of input signals to the error correction circuit; and
determining timings of data correction based on the at least one output signal from the system decoder.

17. A semiconductor device comprising:
a first memory cell array coupled to a first channel;
a second memory cell array coupled to a second channel;
a first error correcting code (ECC) controller on the first channel comprising:
a first ECC circuit configured to apply a first parity check matrix on a first portion of first data from the first memory cell array with a first set of check bits and to provide a first syndrome; and
a first set of correctors configured to correct the first data with the first syndrome;
a second ECC controller on the second channel comprising:
a second ECC circuit configured to apply a second parity check matrix on second data from the second memory cell array with a second set of check bits and to provide a first pre-syndrome; and
a second set of correctors configured to correct the second data with a second syndrome, and
a third ECC controller on the first channel comprising:
a third ECC circuit configured to apply a third parity check matrix on a second portion of the first data from the first memory cell array and to provide a second pre-syndrome; and
a third set of correctors configured to correct the third data with the second syndrome,
wherein the third ECC controller on the first channel further comprises a first adder configured to receive the first pre-syndrome and the second pre-syndrome and to provide the second syndrome to the third set of correctors, and
wherein the second ECC controller on the second channel further comprises a second adder configured to receive the first pre-syndrome and the second pre-syndrome and to provide the second syndrome to the second set of correctors.

18. The semiconductor device of claim 17, wherein a first set of check bits is smaller than a second set of check bits in number of check bits.

19. The semiconductor device of claim 17, wherein the second ECC controller and the third ECC controller is further configured to operate together to produce a second set of check bits from a second portion of first data from the first channel and second data from the second channel.

20. The semiconductor device of claim 17, wherein the first ECC controller includes a first operational switch set and the second ECC controller includes a second operational switch set, wherein the first operational switch set and the second operational switch set are configured to switch between a first mode in which error correction of the third data is executed with the second syndrome on the second channel, and a second mode in which error correction of the third data is executed with the first syndrome on the first channel.

\* \* \* \* \*